United States Patent [19]

Ehrreich

[11] 4,319,920
[45] Mar. 16, 1982

[54] NOVEL ELECTROCONDUCTIVE COMPOSITIONS AND POWDER FOR USE THEREIN

[75] Inventor: John E. Ehrreich, Wayland, Mass.

[73] Assignee: Ercon, Inc., Waltham, Mass.

[21] Appl. No.: 126,681

[22] Filed: Mar. 3, 1980

[51] Int. Cl.³ .............................................. C22B 11/04
[52] U.S. Cl. ................................. 75/0.5 A; 75/118 R
[58] Field of Search ........................... 75/0.5 A, 118 R

[56] References Cited

U.S. PATENT DOCUMENTS 3,725,035 4/1973 Short et al. ........................ 75/0.5 A
3,725,036 4/1973 Ehrreich et al. .................. 75/0.5 A
3,725,047 4/1973 Schneider ......................... 75/118 R
3,816,097 6/1974 Daiga ................................ 75/0.5 A
3,856,507 12/1974 Brug et al. ........................ 75/0.5 A

*Primary Examiner*—W. Stallard
*Attorney, Agent, or Firm*—Robert A. Cesari; John F. McKenna; Andrew F. Kehoe

[57] ABSTRACT

Novel electrically-conductive compositions comprising an organic resin matrix and flakes of a novel conductive silver powder which is characterized by extreme thinness. The novel silver powder, and a novel process for preparing metal powders, are also described.

11 Claims, 3 Drawing Figures

NOVEL ELECTROCONDUCTIVE COMPOSITIONS AND POWDER FOR USE THEREIN

BACKGROUND OF THE INVENTION

This disclosure relates to new forms of metal powder and, in particular, to a new silver powder structure, one characterized by an extremely thin, flake-shaped structure. The powder is characterized by an ability to impart good electrically-conductive properties to silver-filled, oganic-resin matrices at unprecedented low levels of filler loading.

It is already known in the art to provide silver flake materials for use as conductive powders in filling such organic resin-based matrix materials as polyolefins, polyester, acrylic resins, epoxy and polyurethane resins, polyvinyl chloride, silicone resins, and the like. Indeed silver flake materials are the silver particles of choice in most compositions wherein one wishes to minimize silver content while achieving high conductivity.

Silver flake use in such applications is prepared by mechanical means and has been characterized by some contamination by lubricants such as fatty acids used in a flake-forming step and, it is supposed, by some morphological changes associated with work-hardening of the silver during the flake-formation process.

Applicant set out to provide alternate forms of silver flake in the hope that one or more drawbacks of the present flake might be avoided.

SUMMARY OF THE INVENTION

It is a principal object of the invention to provide a new and improved metal powder and, particularly, a silver flake powder.

It is a further object of the invention to provide novel compositions characterized by a surprisingly low silver content in view of the ultimate electrical conductivity achievable with such compositions.

Another object of the inventions is to provide novel articles bearing electroconductive paths on the surface thereof.

A further object of the invention is to provide a novel process for making the aforesaid novel flakes and other metal powders.

The above objects have been achieved by manufacture and use of an extraordinarily thin silver flake particle. In general, the particle is so thin that it tends to be translucent. The particles are small, the median diameter usually ranging from about 1 to 3 microns as measured using the well-known Coulter Counter technique wherein the powder is dispersed in a liquid medium and counted by optical means.

A totally unexpected advantage to the use of the novel silver flake is that high electroconductivities may be achieved in compositions comprising organic resin materials and silver flake at levels far below those necessary when the silver flake of the prior art has been used. This surprising result is apparently assignable to the geometry of the flake.

The silver flake of the invention is preferably less than 0.2 micron thick and most advantageously about 0.1 micron thick or less, individual flakes may appear to be folded back upon themselves.

Bulk density of the preferred flake is below about 1.0 gram per cc. The most preferred products seem to have bulk densities below 0.85 gram per cc, especially in the range of about 0.15 to about 0.5 gram per cc.

The test is typical of those "tap" tests used in the art. Another such test is that using a commercially available volumeter test such as that know to the art as the Tap Pak Volumeter. The flake is often characterized by microhole structure, but this feature is believed to be characteristic of particular processing conditions and not to contribute to the particular value of the flake in imparting electroconductive properties to resin-based compositions.

A remarkable property of the flake is the efficiency by which it forms an electroconductive network in a nonconductive matrix. This appears to be a result of the geometry of the flake and its consequent movement and ultimate placement when it is mixed in various liquids. It is also possible that the process of preparation provides a particularly clean surface (for example, one free of contaminants such as oxide) which further enhances the electroconductive efficiency of the material.

Because of the flake's geometry, it is usually neither convenient nor economic to use the flake in those applications which require resistivities of less than about 1.0 ohm per linear inch of conductor using, as a defining model, a 0.050-inch wide conductor having a thickness of one mil. However, when one is interested in achieving resistivities of, say, in the 3 to 20 ohms per inch range, very great advantages are achieved. Indeed, such resistivities may be achieved at loadings of less than 60% by weight, based on the final coating weight, of silver flake in thin (say 1 to 5 mils thick) conductive coatings of the type laid down from a solvent-based coating composition, when only the flake and organic resin matrix are present in the coating after drying off the liquid vehicle.

The loading may be reduced to less than 50% by weight while still maintaining conductivity in bulk conductive plastic compositions as opposed to thin coatings.

The term "paste" used herein will connote those compositions known to the art which contain, in addition to a conductive powder, a sufficient quantity of liquid resins or solvent to impart a flowability, or at least a functional coatability to the composition. Such pastes are, very often, not themselves electroconductive but are convertible to electroconductive compositions by solidification of the paste by chemical processes, or driving off the solvent. The 60% to 50% loading levels described above are based on solids in the cured or dried compound.

Although the loadings referred to above are based on weight, it should be understood that they represent silver and equivalent geometrically-effective patterns of other materials dispersed in the same matrices will contain greater or lesser weights of conductive filler, depending upon the density of each conductive filler.

A particularly advantageous aspect of the flakes of the invention is that, because of their ability to provide good conductivity at relatively low loadings, the physical properties of resin compositions in which they are incorporated are suprisingly good, in view of the conductivity levels which are achieved, when compared to conductive compositions prepared with previously-known metal fillers. Thus such mechanical properties as flexing characteristics and crease resistance can be improved while achieving excellent long-term electroconductive properties. The combination of such properties and conductivity for such low silver loadings is unprecedented.

The process of the invention is particularly useful in forming noble metal particles such as those of silver, gold, platinum and palladium. Oxides of less noble metals tend to be formed by the process of the invention; but even these materials are of value, for example as pigments, catalysts, and fillers because of their novel surface characteristics and bulk properties.

Once the surprising advantage of a flake of such geometry is evident, there are believed to be many ways to prepare such an ultra thin flake. However, most such processes will be uneconomical. One process appears to be particularly desirable, i.e., the formation of the flake at the interface of a 2-phase reaction system. Such formation of the flake is contemporaneous with the formation of the metal, and thereby provides a flake without the need of first forming silver metal and, only subsequently, subjecting the prior-formed metal to mechanical flake-shaping procedures. It is advantageous if the dispersed phase of the reaction system is liquid, and it is particularly advantageous if the dispersed phase is liquid and comprises a reducing agent that, on reaction with silver ions in the continuous phase, causes silver to plate out on the dispersed phase and, then, continuously break off to present new flake-forming interface to a new supply of silver ions.

There are a number of ways to maintain a suitable interface between different phases. Such an interface can be maintained by a density gradient in a centrifuge, by a physical phase difference in a spray-type system, etc. However, a more economic method appears to be a simple stirred-reactor dispersion of one phase within the dispersion of droplets of a water-immiscible phase in an aqueous phase or the bubbling of a reducing gas into and through an aqueous phase.

Thus it is desirable to disperse a reducing agent such as benzaldehyde within an aqueous matrix in which the silver is dissolved and, subsequently, reacted out in flake form upon the benzaldehyde surface. Although such organic aldehydes as n-valeraldehyde, anisaldehyde, and benzaldehyde are suitable reducing agents, it is noted that the reducing agent surface may be formed of other materials including aldehydes dissolved in a compatible hydrophobic base such as, for example, dodecane. Also some organo-group bearing hydrides can be dissolved in carriers which form a two-phase liquid system with water based metal-ion bearing solution.

The degree of dispersion of the reducing agent is believed to be important in determining flake quality and can be adjusted by agitation, or better, for any reasonable rate of agitation, by using an effective quantity of surfactive agent as a dispersing aid. In general, when using those preferred aldehyde reducing agents having only sparing water solubility, there will be a point where still additional surfactant will cause such great dispersion of the reducing agent that the flake character of the powder produced will diminish and the bulk density will increase rather sharply. It should not be imagined that such powders are not without value; they are small particles of good particle size distribution, but it is to be noted that they are different in geometrical character and conductivity-improving characteristics from the preferred silver flakes of the invention.

Lower bulk densities normally connote a thinner, larger, and more pronounced flake-like character to the product.

To illustrate this point, in typical moderately-stirred systems utilizing the Span 80 surfactant and the benzaldehyde/water system and described in the Examples, the benzaldehyde/water system and described in the Examples, the bulk density of the silver flake dropped from a level of about 1.1 grams per cc with no surfactant to a level of about 0.2 with 6.0 grams of surfactant present, but the density rose to about 0.8 with 12 grams of surfactant present. The reaction system in which this demonstration was made had 60 grams of benzaldehyde and 1440 ml of water plus whatever water was carried into the system with requisite ammonium hydroxide and other reactants. The conclusion to be drawn from this information is that quality of particle shape can be substantially influenced by the degree of dispersion of the dispersed phase and that selection of a proper quantity of dispersing agent for a particular worker's agitation and reaction conditions can materially aid in maintaining a quality of dispersion which will yield a metal product of the particular characteristics desired. This is important when it is realized that many conductive compositions will utilize silver flake with apparent bulk densities of less than about 0.35.

ILLUSTRATIVE EXAMPLES OF THE INVENTION

In order to point out more fully the nature of the present invention, the following working examples are given as illustrative embodiments of the present process and products produced thereby.

IN THE DRAWINGS

FLAKE MANUFACTURE

EXAMPLE 1

Figure 1:
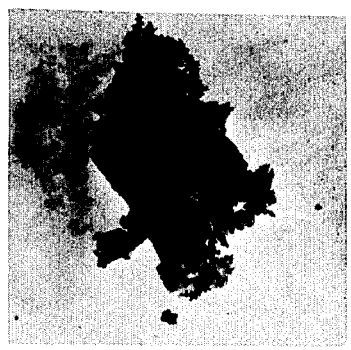
FIG. 1 is a picture of a translucent silver flake of the invention magnified 12,000 times and photographed using an electron microscope and light transmitted through the sample.

A quantity of 0.5 grams of a sorbitan monooleate dispersing agent, a surfactant sold under the trade name Span 80 by Atlas Chemical Industries, Inc. and characterized by a viscosity of 1,000 cs at 25° C. was mixed with 5 grams of benzaldehyde. The resulting mixture was further mixed with 20 ml of distilled water obtaining a fine suspension of benzaldehyde droplets in water.

A quantity of 15 grams of silver nitrate was dissolved in 300 ml of distilled water. Then, 7.5 grams of potassium hydroxide was dissolved in the silver nitrate solution. Thereafter, just enough ammonium hydroxide solution was slowly mixed into the silver solution to, first, cause a precipitate and, then, to redissolve the precipitate. After the precipitate was redissolved, the solution was stirred with a magnetic-type laboratory agitator.

As the silver-bearing solution is stirred, moderately, the benzaldehyde suspension in mixture is added to and reacted with the silver-bearing solution, the mixing is continued for three minutes during which time silver flake is formed in the reaction mixture.

The silver flake is filtered out using a Buchner funnel and vacuum. The resulting flake is rinsed several times with water, several more times with acetone, and thin air dried. The resulting powder is, on examination, discovered to be a foraminous, ultra thin and translucent silver flake of exceptionally low bulk density.

EXAMPLE 2

Following the general procedure of Example 1, 360 grams of silver nitrate was dissolved in 2.4 liters of water. A quantity of 119 grams of KOH was added and, then, enough NH$_4$OH solution was added to cause dissolution of precipitate.

Twelve grams of monooleate surfactant was mixed with 120 grams of benzaldehyde in 480 ml of water.

Thereupon 120 grams of triethanolamine was added to 180 ml of water in a separate receptable.

Also 60 ml of concentrated (37%) formaldehyde was separately diluted with 240 ml of water.

The silver bearing solution was placed in a four-liter reactor and, then the benzaldehyde mixture was added thereto with good, but not violent, agitation. Mixing was continued for 10 minutes; then, the triethethanolamine solution was added. Again, mixing continued for 10 minutes. Then, the formaldehyde solution was added.

(Care should be taken with any combination of reaction vessel and agitation to avoid such vigorous agitation that undesirable comminution of the flake results.)

After another 10 minutes, the reaction mix was filtered to recover the silver flake. It was washed four times, each time with 1 liter of distilled water. The water-washed flake was then washed three more times with denatured alcohol. The resulting silver-flake formed a filter cake which was redispersed in 600 ml of denatured alcohol by two minutes agitation in a Waring Blendor. The silver flake was again filtered, washed with denatured alcohol and mixed with 200 ml of dichloromethane containing 4 grams of stearic acid. Then it was air dried. The flake had an apparent density of 0.29 grams per cubic centimeter. It was ultra thin.

EXAMPLE 3

A quantity of 15 grams of silver nitrate was added to 300 ml of water and 7.5 grams of KOH was added to the vessel and sufficient concentrated ammonium hydroxide was added to dissolve all precipitates. Ten grams of 10% silver nitrate solution was added to this solution.

Then 0.5 grams of the sorbitan monooleate surfactant was added to 5.0 grams of benzaldehyde and then mixed in 20 mls. of distilled water.

The benzaldehyde mixture was added to the silver bearing solution using moderate stirring and mixed for four minutes. The mix is then filtered, washed several times with water and several more times with denatured alcohol. About 0.2 grams of stearic acid was added to the alcohol-wet cake in a methylene chloride solution. The silver flake is then air-dried in a polyethylene sheet. A low density flake is obtained. The flake is pictured in FIGS. 1 and 2.

EXAMPLE 4

Ninety grams of silver nitrate is dissolved in 900 mls. of H$_2$O, and 300 ml of concentrated ammonium hydroxide is added to form a silver-bearing mixture.

Seventy grams of NaOH is dissolved separately in 300 ml of water and cooled to 30° C.

Three grams of the sorbitan monooleate disperant and 60 grams of benzaldehyde are dispersed in 240 ml of water.

The NaOH solution is added to a 2-liter beaker containing the silver-bearing solution with low speed mixing imparted by a turbine blade. After addition and one minute of mixing, the belzaldehyde dispersion is added and mixed for 65 minutes. The resulting flake is filtered, washed with four 500 ml portions of distilled water, and two 400 ml portions of isopropanol. The flake was dispersed in 300 ml of isopropanol, refiltered, washed again with two 400 ml portions of isopropanol, and, while still wet, treated with 1 gram of stearic acid dissolved in 50 ml of methylene chloride. After drying, the yield based on silver was 57.9 grams and the apparent density was 0.27 grams per cc.

EXAMPLE 4A

The flake of Example 4 is mixed into the following composition.

| | |
|---|---|
| 5.4 grams | epoxy resin sold under trade designation 37-140 by Reichold Chemical Co. |
| 0.6 grams | of an epoxy diluent sold by Reichold under the trade designation 37-058 |
| 4.0 grams | silver flake |
| 0.9 grams | tetraethylenepentamine |

The formulation is cured at 96° F. for 40 minutes.

Volume resistivity of a cylinder (about ¼ inch in diameter) was 0.03 ohm-cm.

A coating of this formulation of 0.012 inch thick was 0.17 ohm/square in surface resistivity.

It is to be noted that the weight loading of this material was only 36.7% silver. At these loading levels such prior art silver flake materials as that sold under the trade designation Sil-Flake 135 by Handy and Harmon Co. have no ability to impart any conductivity at all.

EXAMPLE 5

A flake was prepared according to Example 4, except no stearic acid was added. Fifty grams of an acrylic resin, sold under the trade name Acryloid 55D-42 by Rohm and Haas Co., was dissolved in 200 ml butyl acetate and mixed with the flake after the flake had been wetted with butyl acetate solvent. The resultant paint was coated on a polyethylene, i.e., an insulator, surface and air dried to a 1 mil thick coating which, on drying, exhibited an electrical surface resistivity of less than 0.1 ohm (per square).

EXAMPLE 6

The material of Example 2 is mixed into a conventional resin system including the following mixture: an epoxy sold by Shell Chemical Co. under the trade designation EPON 828 and consisting of 33.6 grams flake and 54 grams EPON 828 and 6 grams of butyl glycidyl ether diluent.

Five grams of the mixture were further mixed with 0.45 gram TEPA curing agent and cured overnight at room temperature. The resulting epoxy resin system had good electrical conductivity.

EXAMPLE 7

This example describes the applicability of the process of the invention to other noble metals:

Two grams of HAuCl$_4$.3H$_2$O was dissolved in 30 ml H$_2$O.

Separately, 2 grams of NaOH is dissolved in 10 ml H₂O.

Separately, also, 5 grams of benzaldehyde and 0.5 grams of the monooleate dispersing agent are mixed with 20 ml of H₂O.

The gold-bearing solution is mixed with the sodium hydroxide using a magnetic lab stirrer. Five mls. of the benzaldehyde mixture is then added and mixed for 5 minutes. Gold powder forms and is filtered, washed with water and acetone and air dried. The product has good electrical conductivity.

EXAMPLE 8

Ninety grams of silver nitrate was dissolved in 1200 ml of distilled water. Then 45 grams of KOH was added as was enough concentrated ammonium hydroxide to dissolve any precipitate.

Separately, three grams of the monoleate surfactant sold under the designation of SPAN 80 and 55 grams of n-valeraldehyde were mixed with 240 ml of distilled water.

Then, with a low mixing speed, on the aldehyde-bearing mixture is added to a 2 liter breaker and mixed for 65 minutes. Silver flake precipitated and was washed four times with 500 ml quantities of distilled water, then washed twice more with 40 ml quantities of denatured alcohol. The silver flake was redispersed and treated with 1 gram of stearic acid dissolved in 50 ml of methylene chloride before being air dried.

The yield of silver-flake product was 56.9 grams. Apparent density was 0.59 grams per cubic centimeter.

EXAMPLE 9

Forty grams of silver nitrate were dissolved in 800 ml of water. Twenty grams of KOH were then added to the silver solution. Again, enough ammonium hydroxide was added to redissolve precitate.

Separately, 1.4 grams of a surfactant (a nonionic ester formed by the reaction of ethylene oxide with refined commercial mixtures of unsaturated fatty acids and heterocyclic resin acids) available under the trademark Renex 20 from Atlas Chemical Industries, Inc., is mixed with 14 grams of benzaldehyde in 56 ml of water. Renex 20 is characterized by an HLB value of 13.5 (compared to a value of 4.3 for the Span 80 monoleate).

Thereupon, 35 ml of concentrated (37%) formaldehyde solution and 35 ml of water were mixed in a third vessel.

With only moderate stirring from a magnetic-type stirring rod, the aldehyde-bearing mix was added quickly to the silver-bearing mix and stirred for ten minutes. Then the formaldehyde-bearing mix was added and stirring continued for another twenty minutes. The resulting silver powder was washed with water and alcohol and air dried.

An electrically conductive composition was formed by mixing 19 grams of a commercially-available, one-component epoxy sold under the trade designation UNISET A312 by Amicon Corp., with 9 grams of the silver flake. The composition was cured on a hot plate for 10 minutes at 300° F.

Figure 2:
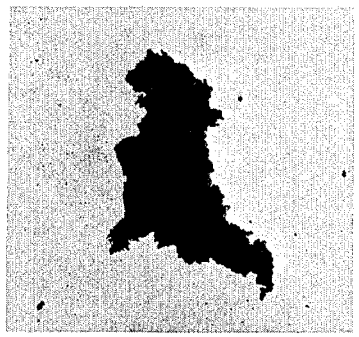
FIG. 2 is a picture of the same kind of flake magnified 24,000 times
Figure 3:
FIG. 3 is a schematic picture depicting a "folded-back" aspect sometimes present in products of the invention.

FIGS. 1 and 2 illustrate two flakes of the invention. While the translucent nature of the flake is shown, it is to be noted there are relatively opaque areas which show a "folded-back" effect. It is believed this effect helps the flakes avoid non-conductive parallel relationships in resin-based compositions. FIG. 3 shows the effect schematically less than about 0.15 micron in thickness, while the average thickness is about 0.2 micron or less.

In preferred embodiments of the invention, some curvature of the flake is believed to aid the excellent electroconductive efficiency when the flake is used to make electroconductive compositions.

It is also to be understood that the following claims are intended to cover all of the generic and specific features of the invention herein described and all statements of the scope of the invention which might be said to fall therebetween.

What is claimed is:

1. A process for forming very thin flakes of noble metal, said process comprising the steps of forming a dispersed phase of a substantially insoluble liquid reducing agent in a solution of a salt of said noble metal reducing said noble metal to metal flake at an interface of said dispersed reducing agent and said solution, and recovering said flake.

2. A process as defined in claim 1 wherein said liquid reducing agent is water-immiscible aldehyde and wherein said solution is an aqueous solution.

3. A process as defined in claim 1 wherein said reducing agent is dispersed with a quantity of surfactant which is sufficient to effectively aid dispersion but insufficient to cause such a degree of dispersion that interfaced area suitably sized for flake formation is substantially eliminated.

4. A process as defined in claim 2 wherein said reducing agent is dispersed with a quantity of surfactant which is sufficient to effectively aid dispersion but insufficient to cause such a degree of dispersion that interface area suitably sized for flake formation is substantially eliminated.

5. A process as defined in claims 1, 2, 3, or 4 wherein said flake is silver flake.

6. A process for forming particles of noble metals, said process comprising the steps of forming a dispersion of a liquid reducing agent material in a solution including said noble metal-bearing solute, said material being immiscible in said solution, reducing said noble metal solute to metal powder at the interface of said dispersed reducing agent material, and recovering said powder.

7. A process as defined in claim 6 wherein said noble metal is silver or gold.

8. A process as defined in claim 6 wherein said reducing agent is water-immiscible aldehyde.

9. A process as defined in claim 1, 2, 3 or 4 wherein said noble metal is silver, wherein said reducing agent is an aldehyde and wherein said solution is an aqueous solution.

10. A process as defined in claim 6 or 8 wherein noble metal is silver, wherein said reducing agent is an aldehyde and wherein said solution is an aqueous solution.

11. A process as defined in claim 1, 2, 3, 6 or 8 wherein said dispersed reducing agent forms a renewable flexible flake-forming substrate surface constantly causing newly-formed flake to break off said flake forming substrate.

* * * * *